United States Patent
Brunotte et al.

(10) Patent No.: US 7,170,585 B2
(45) Date of Patent: Jan. 30, 2007

(54) PROJECTION LENS AND MICROLITHOGRAPHIC PROJECTION EXPOSURE APPARATUS

(75) Inventors: Martin Brunotte, Āalen (DE); Jürgen Hartmaier, Oberkochen (DE); Hubert Holderer, Königsbronn (DE); Winfried Kaiser, Āalen (DE); Alexander Kohl, Āalen (DE); Jens Kugler, Heubach (DE); Manfred Maul, Āalen (DE); Christian Wagner, KS-Eersel (NL)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/101,235

(22) Filed: Apr. 7, 2005

(65) Prior Publication Data

US 2005/0264786 A1 Dec. 1, 2005

Related U.S. Application Data

(63) Continuation of application No. 10/714,573, filed on Nov. 14, 2003, now Pat. No. 6,879,379, which is a continuation of application No. PCT/EP02/04900, filed on May 4, 2002, now abandoned.

(30) Foreign Application Priority Data

May 15, 2001 (DE) ................................ 101 23 725

(51) Int. Cl.
  *G03B 27/54* (2006.01)
  *G03B 27/72* (2006.01)
(52) U.S. Cl. ............................ 355/67; 355/71; 359/494; 250/330
(58) Field of Classification Search ..................... None
  See application file for complete search history.

(56) References Cited

U.S. PATENT DOCUMENTS

| 1,332,410 A | 3/1920 | Potts |
| 4,993,823 A | 2/1991 | Schaffer, Jr. et al. |
| 5,184,176 A | 2/1993 | Unno et al. |

(Continued)

FOREIGN PATENT DOCUMENTS

DE 19807120 8/1999

(Continued)

OTHER PUBLICATIONS

Unno, Yasuyuki, "Distorted wave front produced by a high-resolution projection optical system having rotationally symmetric bireferingence," Applied Optics, Nov. 1, 1998, pp. 7241-7247, vol. 37, No. 31 Opt. Soc. America, USA.

(Continued)

*Primary Examiner*—D. Rutledge
(74) *Attorney, Agent, or Firm*—Fish & Richardson P.C.

(57) ABSTRACT

A projection exposure apparatus for microlithography has a light source, an illumination system, a mask-positioning system and a projection lens. The latter has a system aperture plane and an image plane and contains at least one lens that is made of a material which has a birefringence dependent on the transmission angle. The exposure apparatus further has an optical element, which has a position-dependent polarization-rotating effect or a position-dependent birefringence. This element, which is provided close to a pupil plane of the projection exposure apparatus, compensates at least partially for the birefringent effects produced in the image plane by the at least one lens.

29 Claims, 7 Drawing Sheets

U.S. PATENT DOCUMENTS

| | | | |
|---|---|---|---|
| 5,652,745 | A | 7/1997 | Noguchi et al. |
| 5,805,273 | A | 9/1998 | Unno |
| 5,867,315 | A | 2/1999 | Koike et al. |
| 6,084,708 | A | 7/2000 | Schuster |
| 6,191,880 | B1 | 2/2001 | Schuster |
| 6,201,634 | B1 | 3/2001 | Sakuma et al. |
| 6,248,486 | B1 | 6/2001 | Dirksen et al. |
| 6,252,712 | B1* | 6/2001 | Furter et al. ............... 359/499 |
| 6,285,512 | B1 | 9/2001 | Sudoh |
| 6,307,688 | B1 | 10/2001 | Merz et al. |
| 6,366,404 | B1 | 4/2002 | Hiraiwa et al. |
| 6,646,718 | B2 | 11/2003 | Schuster et al. |
| 6,683,710 | B2 | 1/2004 | Hoffman et al. |
| 6,765,717 | B2 | 7/2004 | Allan et al. |
| 6,775,063 | B2 | 8/2004 | Shiraishi |
| 6,782,074 | B2 | 8/2004 | Sakuma |
| 6,782,075 | B2 | 8/2004 | Pell |
| 6,785,051 | B2 | 8/2004 | Allan et al. |
| 6,788,389 | B2 | 9/2004 | Fujishima et al. |
| 2001/0008440 | A1 | 7/2001 | Hummel et al. |
| 2001/0012154 | A1 | 8/2001 | Schuster |
| 2001/0023042 | A1 | 9/2001 | Dirksen et al. |
| 2001/0038497 | A1 | 11/2001 | Sudoh |
| 2001/0053489 | A1 | 12/2001 | Dirksen et al. |
| 2002/0126380 | A1 | 9/2002 | Schuster |
| 2003/0021026 | A1 | 1/2003 | Allan et al. |
| 2003/0025897 | A1 | 2/2003 | Iwai |
| 2003/0086071 | A1 | 5/2003 | McGuire, Jr. |
| 2003/0086156 | A1 | 5/2003 | McGuire, Jr. |
| 2003/0086157 | A1 | 5/2003 | McGuire, Jr. |
| 2003/0086171 | A1* | 5/2003 | McGuire ............... 359/497 |
| 2003/0099047 | A1 | 5/2003 | Hoffman et al. |
| 2003/0128349 | A1* | 7/2003 | Unno ............... 355/67 |
| 2003/0168597 | A1* | 9/2003 | Webb et al. ............... 250/330 |
| 2003/0197946 | A1 | 10/2003 | Omura |
| 2003/0234981 | A1 | 12/2003 | Hoffman et al. |
| 2004/0001244 | A1 | 1/2004 | Hoffman et al. |
| 2004/0008348 | A1 | 1/2004 | Kishikawa et al. |
| 2004/0036961 | A1 | 2/2004 | Maguire, Jr. |
| 2004/0036971 | A1 | 2/2004 | Maguire, Jr. |
| 2004/0036985 | A1* | 2/2004 | McGuire, Jr. ............... 359/754 |
| 2004/0050318 | A1 | 3/2004 | Sakai |
| 2004/0089023 | A1 | 5/2004 | Hiraiwa et al. |
| 2004/0136084 | A1 | 7/2004 | Unno et al. |
| 2004/0145806 | A1 | 7/2004 | Hoffman et al. |
| 2004/0156051 | A1 | 8/2004 | Takeuchi et al. |
| 2005/0157401 | A1* | 7/2005 | Goehnermeier et al. .... 359/656 |

FOREIGN PATENT DOCUMENTS

| | | |
|---|---|---|
| EP | 0103485 A | 3/1984 |
| EP | 0 480 616 | 4/1992 |
| EP | 0678768 | 10/1995 |
| EP | 0857985 | 8/1998 |
| EP | 0 952 490 | 10/1999 |
| EP | 0 961 149 | 12/1999 |
| EP | 1014139 | 6/2000 |
| EP | 1063551 | 12/2000 |
| EP | 1063684 | 12/2000 |
| EP | 1115030 | 7/2001 |
| EP | 1139138 | 10/2001 |
| JP | 09166710 | 6/1997 |
| JP | 11-54411 | 2/1999 |
| JP | 2001108801 | 4/2001 |
| JP | 2000-331927 | 11/2002 |
| WO | WO9114189 | 9/1991 |
| WO | WO0070407 | 11/2000 |
| WO | WO0101182 | 1/2001 |
| WO | WO0150171 | 7/2001 |
| WO | WO02093201 | 11/2002 |
| WO | WO02097508 | 12/2002 |
| WO | WO02099500 | 12/2002 |
| WO | WO03003072 | 1/2003 |
| WO | WO03003429 | 1/2003 |
| WO | WO03007045 | 1/2003 |
| WO | WO03038479 | 5/2003 |
| WO | WO03046634 | 6/2003 |
| WO | WO04019077 | 3/2004 |

OTHER PUBLICATIONS

Burnett, John H., et al, "Intrinsic birefringence in calcium fluoride and barium fluoride," Physical Review B (Condenced Matter and Materials Physics), Dec. 15, 2001, pp. 241102/1-4, vol. 64 No. 24, APS Through AIP, USA.

Burnett, John H., et al., "Intrinsic Bireferingence in 157nm Materials," International SEMATECH 2nd International Sysmosium on 157nm Lithography, May 15, 2001, Dana Point, California.

Van Peski, Chris, "Birefringence of calcium fluoride," International SEMATECH 2nd zu den Vertretem con Litho. Project Advisory Group May 7, 2001.

Burnett, JH et al., "Preliminary Determination of an Intrinsic Birefringence in CaF2", dated May 7, 2001, 2nd International Symposium on 157nm Lithography in Dana Point, California, May 15, 2001.

Burnett, JH et al., "Intrinsic Birefringence in calcium fluoride", Preprint handed out at 2nd Intl. Symposium on 157nm Lithography in Dana Point, CA, May 15, 2001, XP002232195.

Shiraishi, N. et al., "Progress of Nikon's F2 Exposure Tool Development", Proceedings of the Spie, Spie, Bellingham, VA, 4691(5-7):594-601, (2002), XP008010023.

Nicht-Vertrauliches Schreiben Vom, "Re: Birefringence of calcium fluoride", von Chris Van Peski von Intl. SEMATECH zu den Vertretern von Litho., XP002218847.

Pasternak, J. et al., "Optical anisotropy of silicon single crystals", Phys. Review B (Solid State), Apr. 15, 1971, USA, 3(8):2567-71, XP001109107.

Nogawa, H. et al., "System design of a 157nm scanner", Optical Microlithography XV.2002, 4691:602-12, Proceedings of the SPIR-Int. Soc. Opt. Eng., Santa Clara, CA, Mar. 5-8, 2002.

Mulkens, J. et al., "157-nm technology: Where are we today?", Optical Microlithography XV.2002 4691:613-25, Proceedings of the SPIE-Int. Soc. Opt. Eng., Santa Clara, CA, Mar. 5-8, 2002.

Wang, et al., "Polarized Phase Shift Mask: Concept, Design, and Potential Advantages to Photolithography Process and Physical Design", Proceedings of SPIE 4562, 21st Annual BACUS Symposium on Photomask Technology, pp. 406-417 (Mar. 2002).

Hodgkinson, Ian, "Review of birefringent and chiral optical interference coatings", Optical Interference Coatings, Trends in Optics and Photonics, 63:FA1-FA3 (2001).

Band, Erster, Lexikon der Optik, and certified copy of translation, pp. 380-387 (1999).

Burnett et al., "The Trouble with Calcium Fluoride", SPIE's OEMagazine, pp. 23-25 (Mar. 2002).

Matsuyama et al., "High NA and low residual aberration projection lens for DUV scanner", Optical Microlithography XV, Proceedings of SPIE, 4691:687-95 (2002).

Matsuyama et al., "Microlithographic lens for DUV scanner", Intl. Optical Design Conference, Proceedings of SPIE, 4832:170174 (2002).

Matsumoto et al., "Analysis of Imaging Performance Degradation", Optical Microlithography XVI, Proceedings of SPIE, 5040:131-8 (2002).

Owa et al., "Nikon F2 exposure tool development", Optical Microlithography XVI, Proceedings of SPIE, 5040:772-80 (2003).

Chiba et al., "New generation projection optics for ArF lithography", Optical Microlithography XVI, Proceedings of SPIE, 4691:679686 (2002).

* cited by examiner

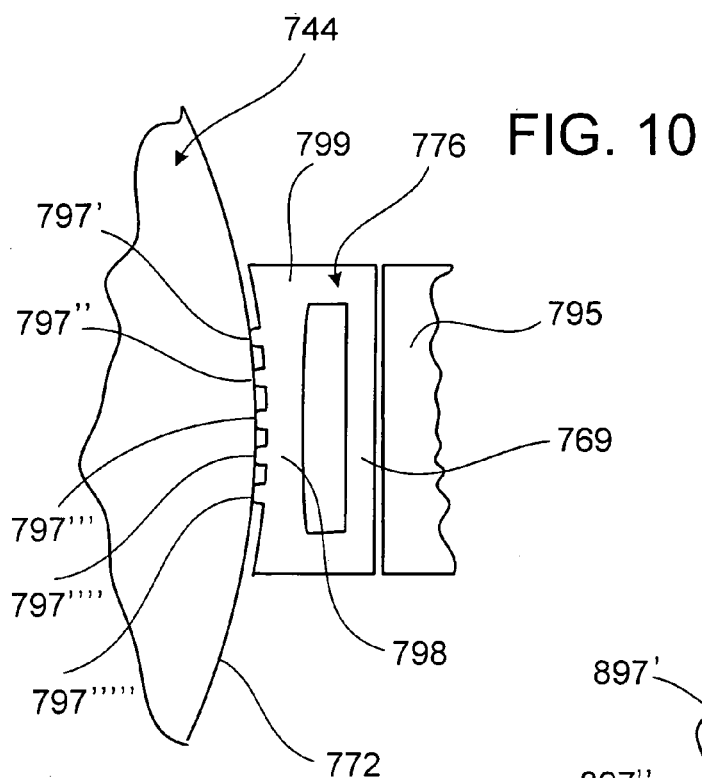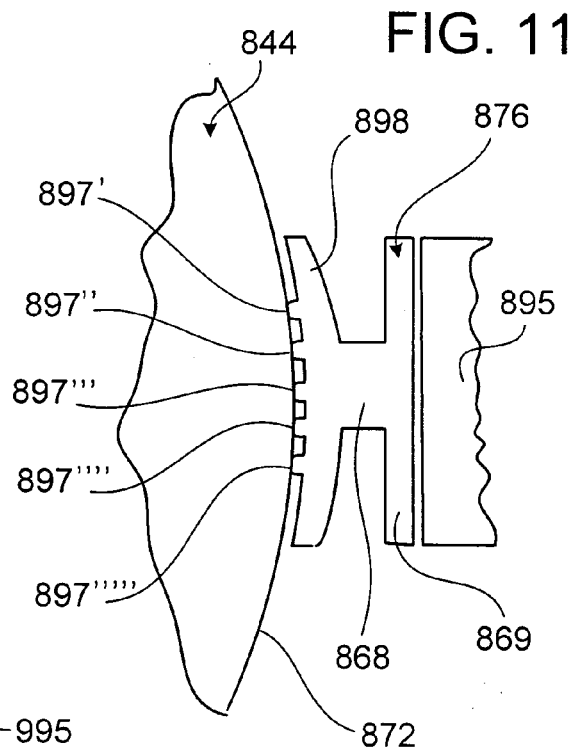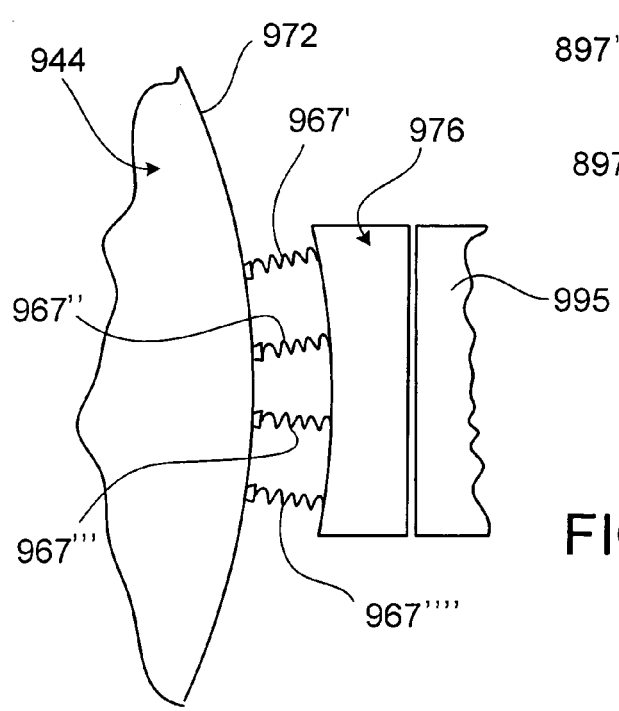

PROJECTION LENS AND MICROLITHOGRAPHIC PROJECTION EXPOSURE APPARATUS

CROSS-REFERENCE TO RELATED APPLICATIONS

This application is a continuation of, and claims the benefit of priority under 35 U.S.C. § 120 to. U.S. patent application Ser. No. 10/714.573, filed Nov. 14, 2003, now U.S. Pat. No. 6,879,379 which, in turn is a continuation of International Application PCT/EP02/04900, with an international filing date of May 4, 2002, now abandoned.

BACKGROUND OF THE INVENTION

1. Field of the Invention

The invention relates generally to projection exposure apparatus and projections lenses used therein. Such apparatus are used for the microlithographic manufacture of electronic circuits and other microstructured devices.

2. Description of Related Art

U.S. patent application Ser. No. 10/177,580 discloses purely refractive and catadioptric projection lenses, with numerical apertures of 0.8 and 0.9 at an operating wavelength of 157 nm, which are suitable for projection exposure apparatus known from the market.

For projection wavelengths in the deep ultraviolet (DUV) fluoride crystals are used as material for lenses and other refractive optical elements. U.S. Pat. No. 6,201,634 B describes that technical fluoride crystals suitable for this use have stress birefringence which exhibits direction dependency with respect to the crystal axes.

It is known from the Internet publication "Preliminary Determination of an Intrinsic Birefringence in $CaF_2$" by John H. Burnett, Eric L. Shirley, and Zachary H. Lewin, NIST Gaithersburg Md. 20899 USA (released on Jul. 5, 2001) that, in addition to stress-induced birefringence, calcium fluoride single crystals also exhibit intrinsic birefringence.

All these cited documents are also intended to be part of the disclosure of this application in their full scope.

These birefringent effects are significant only at short wavelengths below about 200 nm, i.e. in particular at 193 nm and to a greater extent at 157 nm, the wavelengths which are preferred for high-resolution microlithography.

Since this birefringence is dependent on the light-ray direction with respect to the crystal axes, a variation is encountered as a function of both the acceptance angle and the rotation angle (azimuth angle) about the optical axis.

For an optical element, in particular a lens (although it may also be designed as a plane plate, for example a terminating plate or a filter) which is oriented rotationally symmetrically about the (111) crystal axis, the birefringence is a minimum for normal transmission of the light ray. With an acceptance angle of about 35° and at three rotation angles (azimuth angles) mutually rotated by 120°, however, the incidence direction is equivalent to the (110) orientation of the crystal and maximum birefringence occurs.

With a rotationally symmetrical arrangement relative to one of the (100), (010) or (001) axes, the (110)-equivalent axes with maximum birefringence are then found with fourfold rotational symmetry for an acceptance angle of 45°.

Now, with an element made of $CaF_2$ from which a 157 nm light ray emerges with the numerical aperture 0.8, the acceptance angle for transmission with the refractive index of about 1.56 is equal to 31°; for NA=0.9, an angle of about 35° is found. The direction-dependent birefringence is therefore a problem with such wide-acceptance systems.

SUMMARY OF THE INVENTION

It is therefore an object of the invention to provide compensation for this perturbation due to direction-dependent birefringence, with which even very-large aperture projection lenses can be operated optimally.

This object is achieved by a projection exposure apparatus according to Claims 1, 46 and 47, by a projection lens according to Claim 16, a production method according to Claim 49 and a microlithographic structuring method according to Claim 51.

The invention is based on the discovery that, on the one hand, the perturbation due to the birefringence with a value about 6 nm per cm, for a typical optical path of about 10 cm in lenses, predominantly represents a phase shift of up to about one-quarter lambda at large angles for two rays polarised perpendicularly to one another, and, on the other hand, that the large ray angles occur in (near-field) elements close to the image, the ray-angle distributions of which appear as position distributions in a pupil plane Fourier-transformed with respect thereto.

Surprisingly, therefore, the perturbation can be corrected by a position-dependently polarization-rotating or position-dependently differently birefringent optical element (correction element) close to a pupil plane. Such elements, and their production by local polishing, in particular by ion-beam polishing, are known, for example from U.S. Pat. No. 6,252,712 B1 and are also available in this new context.

The situation "close" to a pupil plane, preferably the system aperture plane, is a practical approximation of the situation for which the local distribution of polarization and phase at the correction element is transformed sufficiently well into its angle distribution at the angle-dependently birefringent element. This is, in particular, to be adjusted according to the optical design of the projection lens.

Besides this approach it is also possible separately or in combination therewith to reduce the birefringent effects of a plurality of such elements by installing them rotated with respect to one another.

When mounting and adjusting optical systems, it is in fact common practice to compensate for case-specific perturbations of framed elements by relative rotation. In this case, however, the rotational symmetry broken by the angle-dependent birefringence is taken into account by a relative rotation to be dictated by the optical design, so that the perturbation is reduced.

In the example of two equally thick calcium fluoride elements in the (111) orientation and with the same transmission angles, the two are rotated by 60° relative to one another so that maxima and minima of the respective birefringences are exactly overlaid, which approximately halves the effect. An associated correction plate then has sixteen-fold rotational symmetry.

Since both the perturbation and the required shape modification at the correction element are small, when producing a projection lens it is possible to first construct and align it completely, and then analyze and adjust it. Intrinsic and case-specific stress birefringences can then be compensated for at the same time.

Advantageous embodiments are described in the dependent claims.

The embodiment according to Claim 15 provides for conversion from radial to tangential polarization in the projection lens by an optically active element.

Besides the provision of a suitable local thickness distribution, a desired compensating action of the correction element can also be produced by the introduction of, for example, tensile or compressive stresses by means of a force-inducing device according to Claim 21, and a stress birefringence intentionally caused thereby.

The use of at least one piezo-actuator according to Claim 22 leads to the possibility of setting an amplitude precisely for the force induction. As an alternative to piezo-actuators, it is also possible to use other active actuators, for example pneumatic actuators, or even passive manipulators, for example adjustment screws or pretensioned springs.

With force induction over the circumferential surface of the correction element according to Claim 23, it is possible to retain the entire free aperture of the correction element. When inducing mechanical forces in the correction element, it is expedient to induce the forces along a neutral fibre or a neutral surface of the correction element, so that no undesired deformations of the correction element are induced. To a first approximation, such force induction is achieved when care is taken to cause no flexural deformation of the optical element.

With the aid of a force-inducing device according to Claim 24, it is possible to provide defined force induction in the direction of the neutral surface of the optical element.

A movable bearing body according to Claim 25 ensures subsequent fine adjustment of the force induction.

A spring according to Claim 26 prevents tilting of the bearing body with respect to the correction element.

A hinge according to Claim 27, which may be provided as an alternative or in addition, prevents tilting of the bearing body with respect to the correction element by ensuring defined mobility of the bearing body relative to the correction element.

A solid-state hinge according to Claim 28 is free from wear and can be produced compactly.

With the aid of a bearing body according to Claim 29, it is possible to induce a defined force distribution in the correction element. In this case, a first degree of freedom for this distribution can be provided by the extent or the offset of the force-inducing positions, so that a second degree of freedom can be adjusted by means of the bearing force to be induced in absolute terms.

With a bearing body according to Claim 30, it is possible to obtain a distribution of the force induction which is progressively variable in the circumferential direction.

This is also possible by means of an alternative or additional version of the bearing body according to Claim 31.

The design of a force-inducing component according to Claim 32 allows an easily achievable possibility of force induction along the neutral surface of the correction element, since the forces that can be induced via the two force-inducing positions may be matched to one another accordingly.

An arrangement of the force-inducing bodies according to Claim 33 allows the possibility of finely adjusting the force distribution between the two force-inducing bodies in order to produce an overall force along the neutral surface of the correction element.

The arrangement of the force-inducing bodies according to Claim 34 is straightforward. The adaptation of the force induction in order to produce an overall force along the neutral surface of the correction element is in this case carried out by means of the geometrical configuration of the lever arms.

The alternative provision of the actuators according to Claim 39 allows precise force induction.

The use of an actuator according to Claim 36 allows a flatly constructed embodiment of a force-inducing device in the direction of the optical axis of the optical system.

With the aid of a force-inducing body according to Claim 37, the force induction can be controlled deliberately by means of the arrangement and configuration of the force-inducing component in order to produce an overall force in the direction of the neutral surface of the correction element.

This can be done in a particularly straightforward way by means of the actuator according to Claim 38.

A ring according to Claim 39 is a particularly simple counter-support body for a force-inducing device, which may then also be designed as a component carried by the correction element itself. As an alternative or in addition, it is possible to use a support ring which encloses the correction element and on which the actuator acting on the correction element, which need not itself be of annular design, is supported. The use of such rings furthermore allows a force-inducing device in which no lateral displacement of the correction element can occur during the force induction.

Owing to the large static forces which are required during static force induction, damage to the correction element cannot always be ruled out. Furthermore, the stress state of the correction element may change over time under prolonged force induction, for example owing to drift effects. These restrictions are overcome when a correction element according to Claim 40 is used. A substantially higher stress birefringence can be produced briefly with dynamic force induction, without the risk of breakage, than is the case with static force induction. Furthermore, the value of the corrective action to be obtained may optionally be adjusted sensitively by means of the amplitude of the dynamic force induction, and this may even be done externally with a completed projection lens.

An average force induction which is comparable to that of static force induction can be obtained by means of a force-inducing device according to Claim 41.

In this case, a force-inducing device according to Claim 42 leads to maximisation of the corrective action for a given applied force.

A projection exposure system according to Claim 47, with force induction in-time with the emission of the projection-light beam, leads to the compensation always being obtained accurately when projection light is shone through the projection optics. The load on the correction element is reduced at the same time.

A control device according to Claim 48 then ensures simple matched timing.

When a force-inducing device according to Claim 43 is used, a refractive-index profile which has a similar spatial distribution to the sound-wave profile is produced by means of the sound-wave profile. The sound-wave profiles can be resolved into the Zernike functions in a similar way to optical wavefronts. Any superposition of orthogonal Zernike basis functions can therefore be produced as refractive-index profiles. With a number N of actuators, for example, correction profiles can be produced with a multiplicity of N/2. In principle, all known imaging errors can be reduced in this way.

A standing sound wave according to Claim 44 leads to static imaging-error correction.

As an alternative, dynamic imaging correction may be carried out according to Claim 45. In this case, for example, the imaging properties of the objective can be deliberately modified during the projection by using an intermittent projection-light beam, so that optimum imaging conditions for the projection prevail at the time when the light beam is affected by the optical element. As an alternative, by the dynamic imaging-error correction according to Claim 45 it is possible to produce a slowly, for example of the order of magnitude of $1/100$ s, variable force distribution in the optical element on the timescale of the light application, for example in order to optimise the corrective action on the illumination distribution which is used or on the reticle structure just imaged.

BRIEF DESCRIPTION OF THE DRAWINGS

Exemplary embodiments of the invention will be explained in more detail below with reference to the drawing, in which:

FIGS. 9 to 12 show embodiment variants of alternatives of bearing bodies which can be used in conjunction with the force-inducing devices represented above.

DESCRIPTION OF PREFERRED EMBODIMENTS

Figure 1:
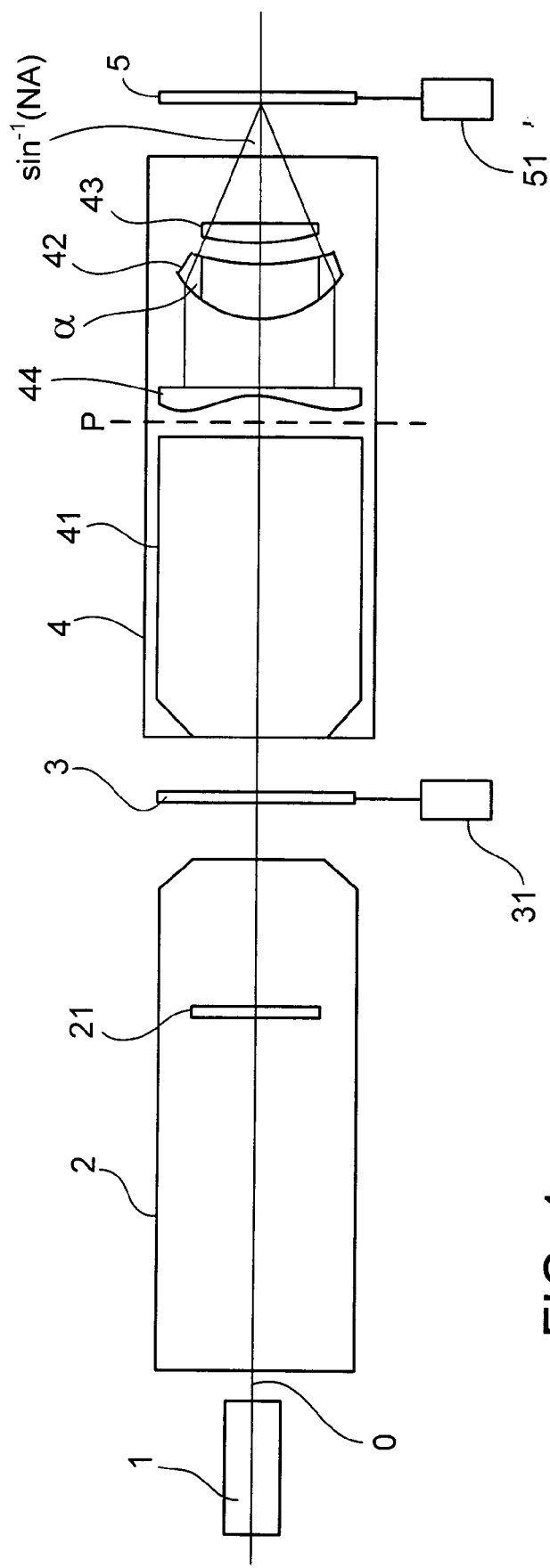
FIG. 1 schematically shows projection exposure apparatus according to the invention, partially in meridian section.

Arranged with respect to an optical axis O, FIG. 1 shows a light source 1, which is preferably a laser emitting with a narrow band at 157 nm or 193 nm. Its light is delivered to an illumination system 2 which, as a special feature, may contain means 21 for producing radial polarization, as are known from DE 195 35 392 A which is equivalent to U.S. Pat. No. 6,392,804. This is used to illuminate a reticle 3 which is connected to a reticle-holding and positioning system 31. The subsequent projection lens 4 images the reticle 3 onto an object 5—typically a wafer—arranged in the image plane. The object 5 is provided with an object-holding and -positioning system 51.

The projection lens 4 comprises a group 41 of lenses and, if need be, also one or more mirrors, a pupil plane or system aperture plane P and, between this plane P and the plane of the object 5, lenses 42, 43 whose transmission angle a is determined by the numerical aperture NA on the image side of the projection lens.

At least one of the lenses 42, 43 consists of a material with angle-dependent birefringence, for example calcium fluoride, the (111) orientation of which coincides with the optical axis O or deviates by up to about 5°.

If both lenses 42, 43 which are shown (naturally, even more lenses are normally necessary in this region) are of this type, then they will preferably be installed rotated relative to one another around the azimuth angle, i.e. around the optical axis O.

For each light ray, an acceptance angle encountered at one of the near-field lenses 42, 43 is transformed to a distance from the optical axis O in the vicinity of the pupil plane P. The correction element 44 arranged there according to the invention, made of birefringent, stress-birefringent or optically active material, can therefore compensate for the angle-dependent birefringence of the lenses 42, 43 by a thickness varying with a distance from the optical axis O and with the azimuth angle, and thus a position-dependent polarization rotation or position-dependent different birefringent effect.

The means 21 and the correction element 44 can produce radial polarization at the object 5, with the correction element 44 simultaneously compensating for the angle-dependent birefringence in the scope of the invention.

If the projection lens 4 has other pupil planes, which is for example the case in embodiments with an intermediate image, then a correction element may also be arranged there.

If the refractive effects of the thickness profile of the correction element 44 cause perturbations, then compensation may be carried out with compensation plates as known from U.S. Pat. No. 6,252,712 B1 made of a material with little or no birefringence. Lens surfaces may also be modified to this end, for example by ion-beam etching.

The described effect of the angle-dependent birefringence of the fluoride crystals can be taken into account in the optical design of large-aperture projection lenses. To this end, the variation as a function of the azimuth angle must be taken into account. The correction element 44 may have its shape or action dictated by the design.

As an alternative, or in addition, the perturbation of the imaging due to the angle-dependent birefringence may also be measured and incorporated for further modification of the correction element 44 which is provided. A case-specific birefringence distribution can thus be corrected at the same time.

Further variants of optical correction elements are shown in FIGS. 2 to 12. Components which correspond to those that have already been described with reference to FIG. 1 have reference numerals respectively increased by one hundred in these further variants, and will not be explained in detail again.

Figure 2:
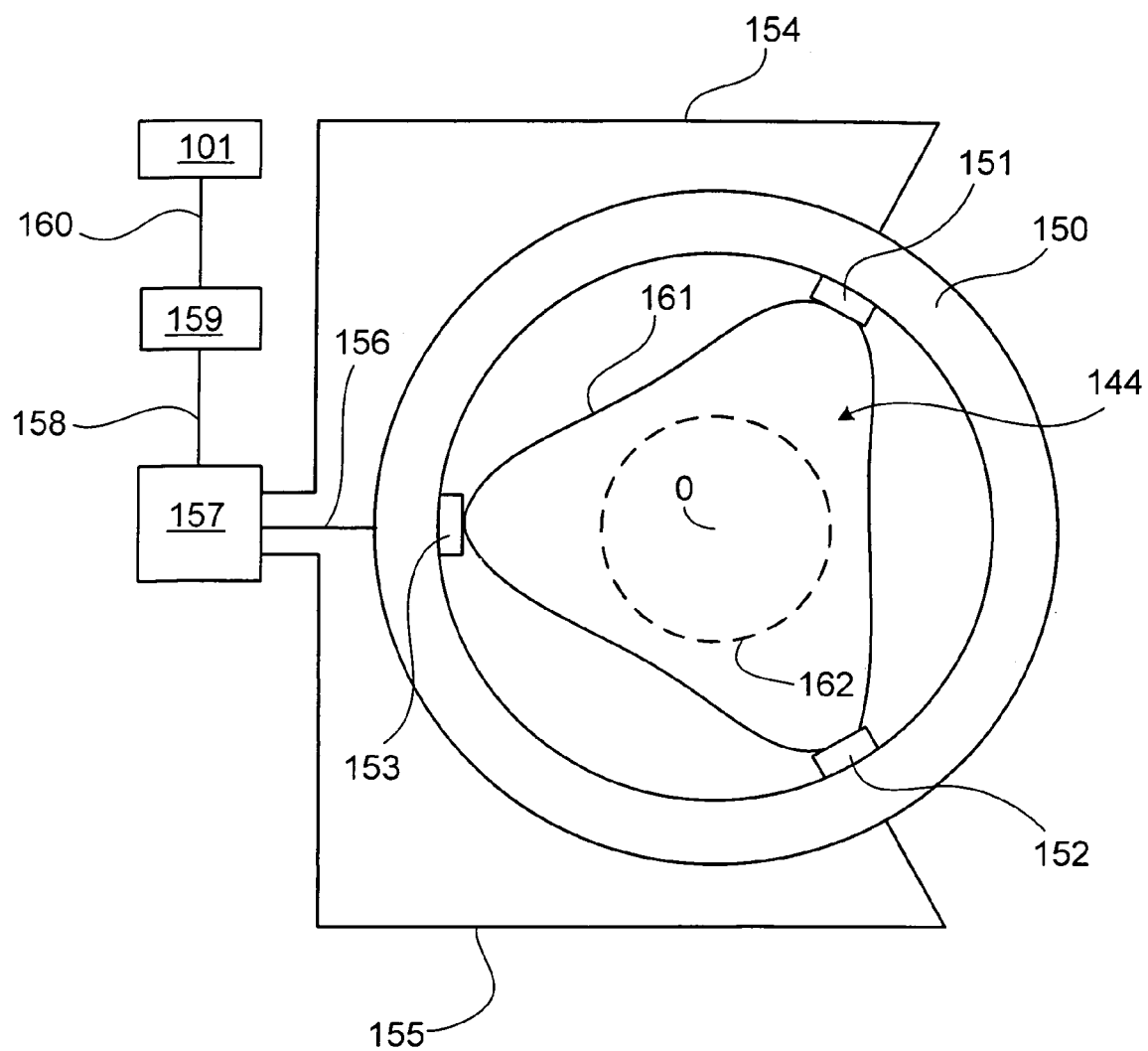
FIG. 2 shows an optical correction element, which is an alternative to the one integrated in the projection exposure apparatus according to FIG. 1.

FIG. 2 shows an enlarged plan view of an alternative correction element 144 in the dismounted state, i.e. not integrated in a projection lens. The correction element 144 is a $CaF_2$ plate with threefold symmetry, and thus consists of a material with stress-birefringent properties. Its circumferential surface 161 is substantially in the form of an equilateral triangle with rounded vertices and side faces curved slightly in the direction of the centre of the triangle (crossing point of the optical axis O).

The correction element 144 is mounted in a round frame 150 and is connected to respective piezo-actuators 151 to 153 via a section at each of the rounded vertices of the circumferential surface 161. Each piezo-actuator 151 to 153 is fitted into the frame 150 on the other side from the correction element 144. The piezo-actuators 151 to 153 are connected via signal lines 154 to 156, which are fed out through corresponding bores in the frame 150, to a piezo-drive unit 157. The latter is connected via a signal line 158 to a synchronisation unit 159, which is in turn connected to the light source 101 via a signal line 160.

For use, the correction element 144 is integrated into the projection lens 4; projection light can propagate through it in a circular transmission region 162, which is represented by dashes in FIG. 2. The correction element 144 then functions as follows:

The light source 101 is an excimer laser, which is characterised by a quasi-CW projection-light pulse train with individual pulses of short pulse length (about 10 ns) and a relatively low repetition rate in the range of 10 kHz.

The piezo-actuators 151 to 153 are driven by the piezo-drive unit 157 so that radial density oscillations are imparted to the correction element 144. The frequency of these oscillations is matched to the repetition rate of the light source 101 with the aid of the synchronisation unit 159, so that a maximum of the compressive stress produced, for example sinusoidally, by means of the piezo-actuators 151 to 153 is achieved in the correction element 144 during the laser pulse. During the short pulse length of the individual light pulses, which is only about one ten-thousandth of the repetition period of the light source 101 and the duration of the force induction in the correction element 144, the instantaneous force induced in the correction element is constant to a good approximation. No significant changes in the birefringent state of the correction element 144 therefore occur during the pulse length of the individual light pulses, irrespective of the phase relation between the laser pulse and the force induction.

Via the amplitude of the signal voltage on the signal lines 154 to 156, which is for example sinusoidal, the stress birefringence can be adjusted by means of the piezo-drive unit 157. As an alternative, it is also possible to adjust the stress birefringence by means of the phase relation between the laser pulse and the force induction. This phase relation can be altered so that the laser pulse is transmitted through the correction element 144 not during the maximum of the compressive stress, but instead during a selectable section on the leading or trailing edge of the induced compressive stress, for example.

The geometry of the correction element 144 is matched to the geometry of the force induction by the piezo-actuators 151 to 153 and to the force-inducing frequency, so that the natural oscillation of the correction element 144 is in resonance with the force-inducing frequency. This ensures a maximum force effect and therefore a maximum stress birefringence produced for a given applied force. Besides compressive stresses, tensile stresses are also produced by the resonant oscillation of the solid body in this embodiment, so that the variety of possible birefringence distributions is substantially increased.

With the aid of the piezo-actuators 151 to 153 (cf. FIG. 2), assuming that the drive frequency of the piezo-actuators 151 to 153 is suitable, it is possible to produce either a standing or travelling sound wave in the correction element 144. In order to produce a standing sound wave, the drive frequency for the piezo-actuators 151 to 153 will be matched accordingly to the geometry and the material of the correction element 144. Depending on the number of piezo-actuators acting on the correction element 144 via the circumferential surface 161, it is possible to produce a corresponding multiplicity of the resulting sound waves. With n piezo-actuators, a standing sound wave can in this case be produced with up to n/2-fold symmetry. It is also possible to produce overlays of sound waves of different multiplicity. This leads to a refractive-index profile in the correction element 144 which can be predetermined in a controlled way by means of the sound-wave profile.

By overlaying sound-wave profiles with different multiplicities, it is possible to set up a corresponding overlay of refractive-index profiles as a superposition, which can be used for independent correction of a plurality of imaging errors since, for example, Zernike function coefficients describing the imaging properties can be influenced in a predetermined way by means of the different refractive-index contributions from sound-wave profiles of different multiplicity.

For currently used correction-element materials and typical correction-element geometries, drive frequencies to be used for the piezo-actuators 151 to 153 are found in the ultrasound range.

By means of the stress birefringence distribution which is produced, and which can be adapted via the geometry of the correction element 144, via the geometry of the coupling of the piezo-actuators 151 to 153, via the amplitude and frequency of the force induction and optionally via components which create oscillation nodes in the correction element 144, the projection-light beam transmitted through the correction element 144 is influenced so as to compensate for the other birefringent effects in the projection optics, as explained in connection with FIG. 1.

As an alternative to piezo-actuators, it is also possible to use other compressive or tensile means for the force induction.

Figure 3:
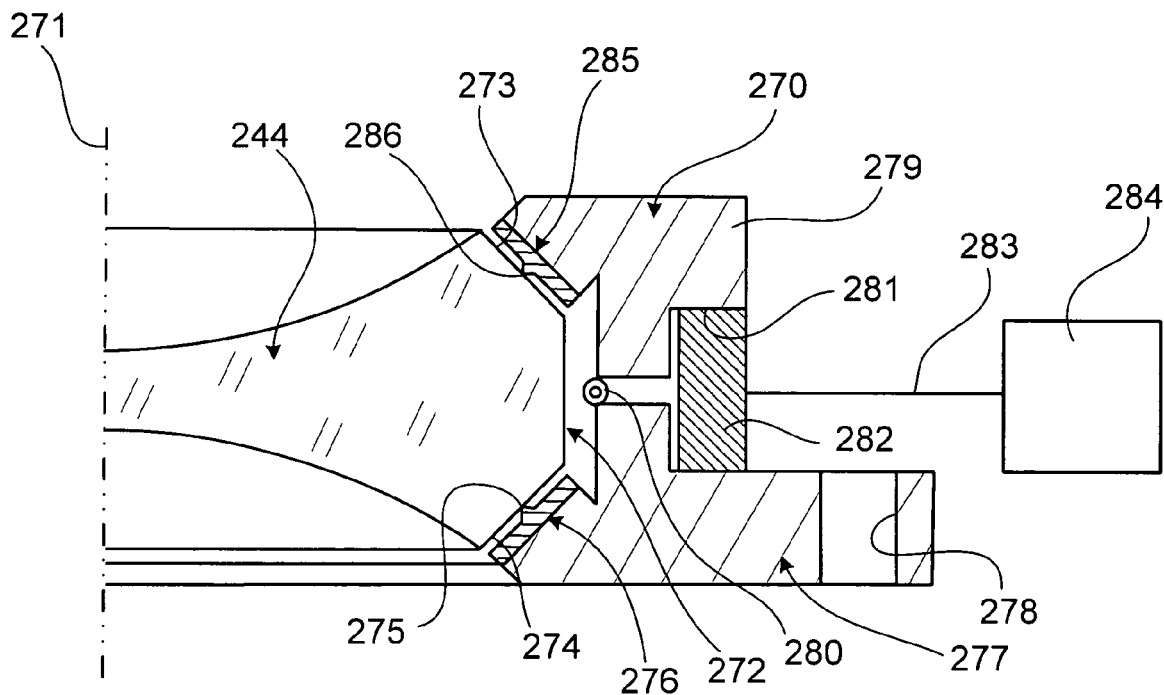
FIG. 3 shows a meridian section of one half of another alternative optical correction element.

FIG. 3 shows a meridian section of another variant of an optical correction element with a force-inducing device, which is an alternative to the one described in connection with FIG. 2.

In the embodiment according to FIG. 3, the optical correction element 244 is a symmetrically biconcave lens made of $CaF_2$, on which a force-inducing device denoted overall by 270 acts peripherally. The optical correction element 244 and the force-inducing device 270 have manifold rotational symmetry about an optical axis 271 shown by dots and dashes in FIG. 3, so that the representation in FIG. 3 is limited to the right-hand half as seen from the optical axis 271.

At the edge, the correction element 244 is bevelled on the top and the bottom, so that the circumferential surface 272 of the correction element 244 is respectively joined via an annular bevel surface 273, 274 to the convex optical surfaces of the correction element 244. Since the bevel surfaces 273, 274 are not part of the optical surfaces of the correction element 244, they may be regarded as part of its overall circumferential surface.

The lower bevel surface 274 in FIG. 3 bears via a bearing tip 275 of a bearing body 276 on a base body 277 forming the frame of the correction element 244. The bearing body 276 and the base body 277 are connected flush with one another, for example adhesively bonded to one another. The base body 277 has a plurality of bores 278 at the edge, which are formed parallel to the optical axis 271 through the base body 277 and are used for fastening the base body 277 to a holding fixture (not shown) for the correction element 244.

A plurality of lever bodies 279 are fitted articulated on the base body 277. For example, there may be three lever bodies 279 arranged equally distributed around the circumferential surface 272 of the correction element 244. The number of lever bodies 279 dictates the multiplicity of the rotational symmetry of the force-inducing device 270. Only one of the lever bodies 279 is represented in FIG. 3. The lever bodies 279 all have the same structure, so that it is sufficient in what follows to describe the lever body 279 represented in FIG. 3. It is articulated via a hinge 280 on the base body 277. The hinge 280, like the other hinges which connect the other lever bodies 279 to the base body 277, has a hinge axis extending parallel to a tangent at the closest point of the circumferential surface 272 of the correction element 244. The hinges (cf. the hinge 280) are in this case arranged at a height which corresponds to the situation of the mid-plane of the correction element 244 perpendicular to the optical axis 271.

On the other side of the hinge 280 from the circumferential surface 272, the base body 277 and the lever body 279 have stepped cut-away parts facing one another, so as to produce overall a holding recess 281 next to the hinge 280. Fitted therein is a piezo-actuator 282 whose length is variable in a direction parallel to the optical axis 271. The piezo-actuator 282 is connected to a control device 284 by means of a control line 283 indicated in FIG. 3.

The lever body 279 bears on the upper bevel surface 273 in FIG. 3 via a bearing body 285 and a bearing tip 286, so that the lever body 279 engages with the section of the base body 277 assigned to it via the bearing bodies 285, 276 in the manner of tongs on the bevel surfaces 273, 274 of the correction element 244.

The correction element 244 coupled to the force-inducing device 270 is used as follows:

On the basis of the imaging error to be compensated, the control device 284 calculates a stress distribution which is to be set up in the correction element 244, so that compensation for the imaging error can be achieved by the changes in the optical properties of the correction element 244 due to this stress distribution. From the calculated stress distribution, the control device 284 determines deflection values which the piezo-actuators 282 of the force-inducing device 270 must transmit to the respective lever bodies 279 so as to obtain force induction, which leads to the formation of the calculated stress distribution, by means of the consequent tongs action between the base body 277 (cf. bearing tip 275) and the lever bodies 279 with the bearing tips 286 on the bevel surfaces 273, 274. The bearing tips 275, 286 here ensure defined force induction without tilting. Owing to the symmetry of the tongs formed by the bearing bodies 276, 285 with respect to the mid-plane of the correction element 244, this resultant of the induced forces extends in this mid-plane which coincides with the neutral surface of the correction element 244. Flexural deformation of the correction element 244, or the transmission of a bending moment thereto, due the force application by the piezo-actuators 282 is avoided in this way.

Figure 4:
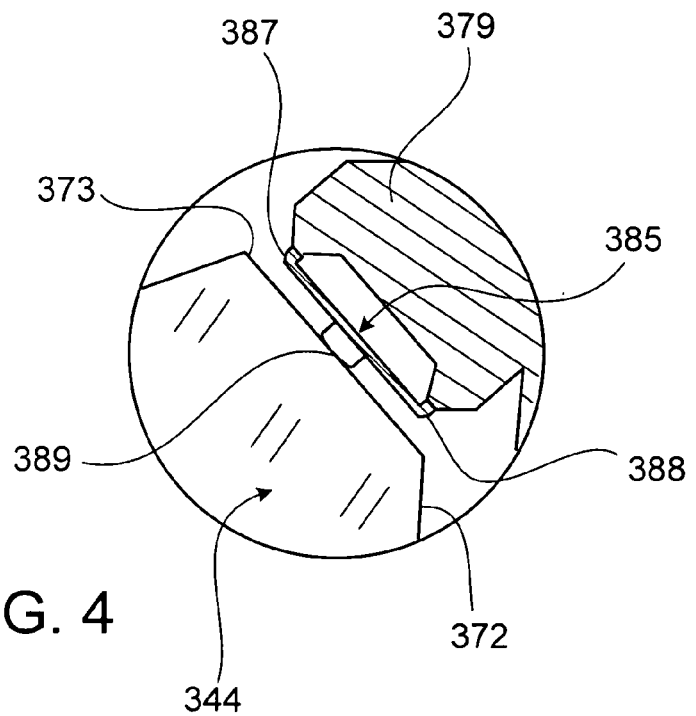
FIG. 4 shows a detailed excerpt of one movable bearing body of a force-inducing device cooperating with the optical correction element according to FIG. 3, which is an alternative to the bearing body according to FIG. 3.

FIG. 4 shows an alternative bearing body 385 in a detailed cutout, which corresponds to the one which is marked by an unbroken circle in FIG. 3. The bearing body 385 is articulated on the lever body 379 via two hinge connections 387, 388. These are arranged on the "roof edges" of two triangular juts of the lever body 379, between which the lever body 379 is set back so that it is separated from the bearing body 385 between the hinge connections 387, 388.

The bearing body 385 is made of resilient material. On its other side from the lever body 379, the bearing body 385 has a bearing lug 389 which bears on the bevel surface 373 of the correction element 344.

The other bearing bodies in the embodiment according to FIG. 3 may also be designed similarly to the bearing body 385 according to FIG. 4.

The bearing body 385 functions as follows:

Depending on the geometrical situation of the two hinge connections 387, 388 with respect to the bevel surface 373, so long as no force induction takes place the bearing body 385 is arranged either parallel to the bevel surface 373 or at a particular angle with respect to it. The spring action of the bearing body 385 and the hinge connections 378, 388 ensure that, irrespective of whether there is such an angle, the bearing lug 389 always acts on the bevel surface 373 without tilting during the force induction.

The hinge connections 387, 388 may be designed as conventional hinge connections or as solid-state hinges.

Figure 5:
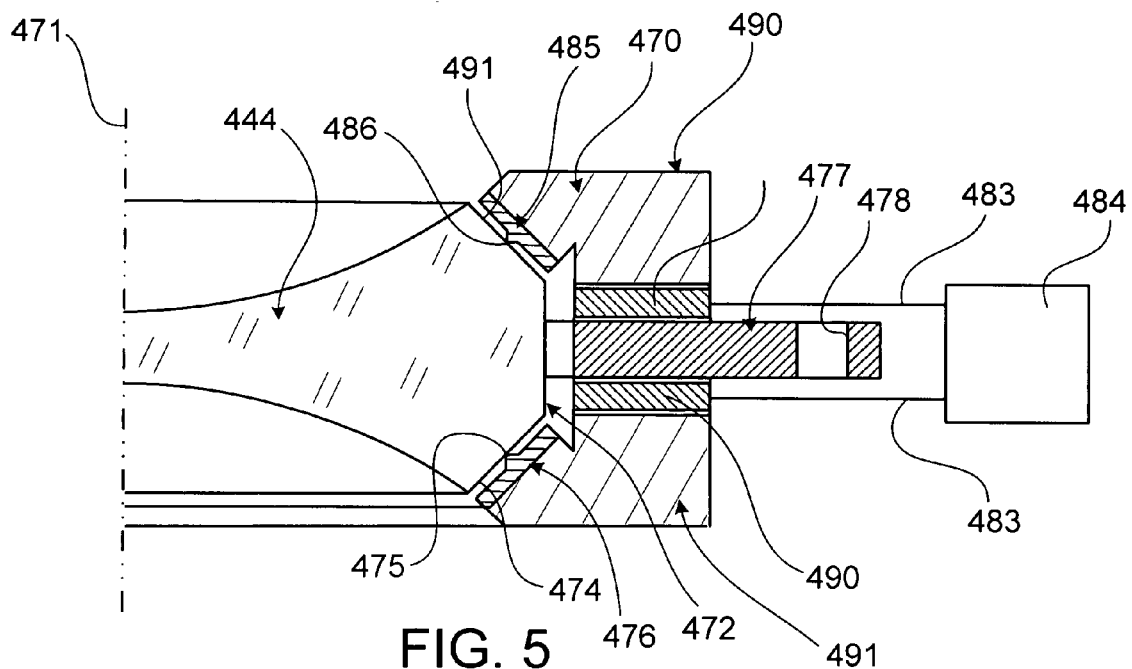
FIG. 5 shows a similar representation to FIG. 3 of an optical correction element with an alternative force-inducing device.
Figure 6:
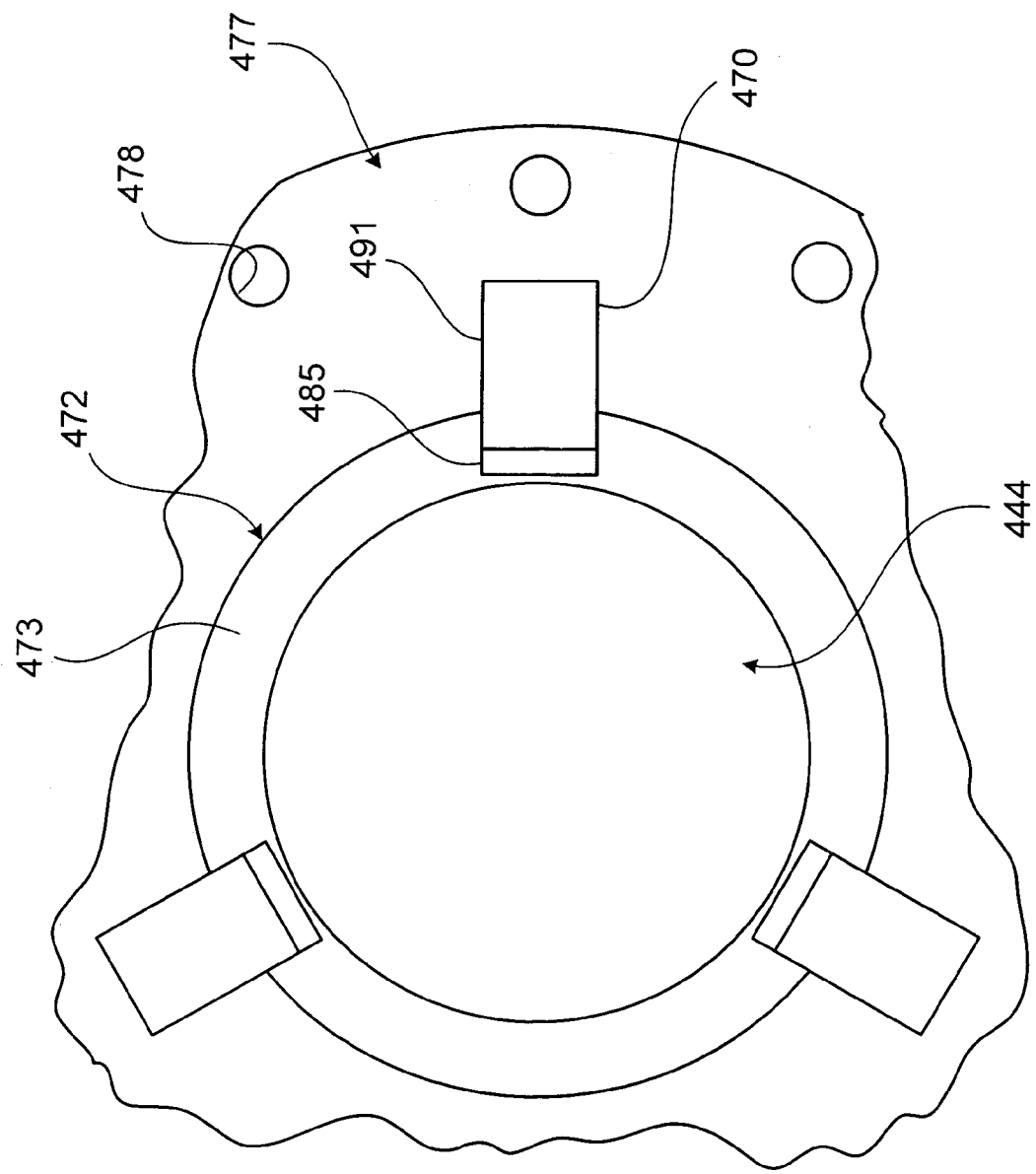
FIG. 6 shows a plan view of the embodiment according to FIG. 5.

An alternative force-inducing device 470, having three-fold rotational symmetry, for the correction element 444 is represented in FIGS. 5 and 6. The base body 477 with the bores 478 is designed as a ring which encloses the circumferential surface 472 of the correction element 444, and which is also represented only partially in FIG. 6.

The force-inducing device 470 is also mirror-symmetric with respect to the mid-plane of the correction element 444 extending perpendicular to the optical axis 471, so that it is sufficient in what follows to describe in detail only the upper half of the force-inducing device 470 in FIG. 5.

A plurality of shear piezo-actuators 490 are connected flush with the base body 477, FIG. 5 showing two of these which bear on both sides of the base body 477 while lying opposite one another. The shear piezo-actuators 490 are connected to the control device 484 via control lines 483.

On the other side of the base body 477, the shear piezo-actuators 490 are respectively connected flush with thrust bodies 491, which bear on the bevel surfaces 473, 474 of the correction element 444 via bearing bodies 476, 485 with bearing tips 475, 486.

In all, the force-inducing device 470 is formed by three pairs of thrust bodies 491 lying opposite one another with respect to the base body 477, with associated shear piezo-actuators 490 which are arranged respectively offset by 120° around the circumferential surface 472 of the correction element 444.

The correction element 444 with the force-inducing device 470 is used as follows:

First, a calculation of setpoint values for the force induction of the thrust bodies 491, or the associated deflections of the shear piezo-actuators 490, is carried out in the control device 484 in a similar way to that described in connection with FIG. 3. These setpoint specifications are converted into the desired stress distribution in the correction element 444 by driving the shear piezo-actuators 490 via the control lines 483.

The force components imparted via the shear piezo-actuators 490, acting via the bearing tips 475 on the one hand and 486 on the other hand, are dimensioned so that they add up to an overall force in the neutral surface of the correction element 444. In a similar way to that described above in connection with the force-inducing device 270, no bending moments are therefore exerted on the correction element 444.

Figure 7:
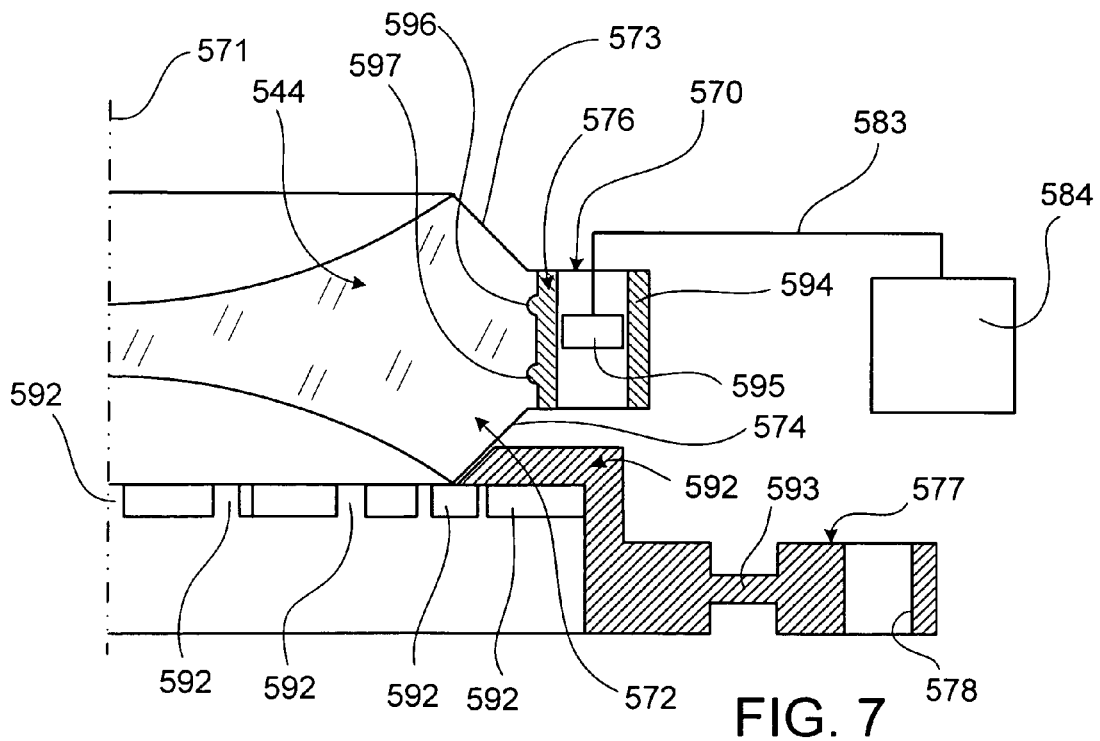
FIG. 7 shows a similar representation to FIGS. 3 and 5 of an alternative optical correction element with an alternative force-inducing device.
Figure 8:
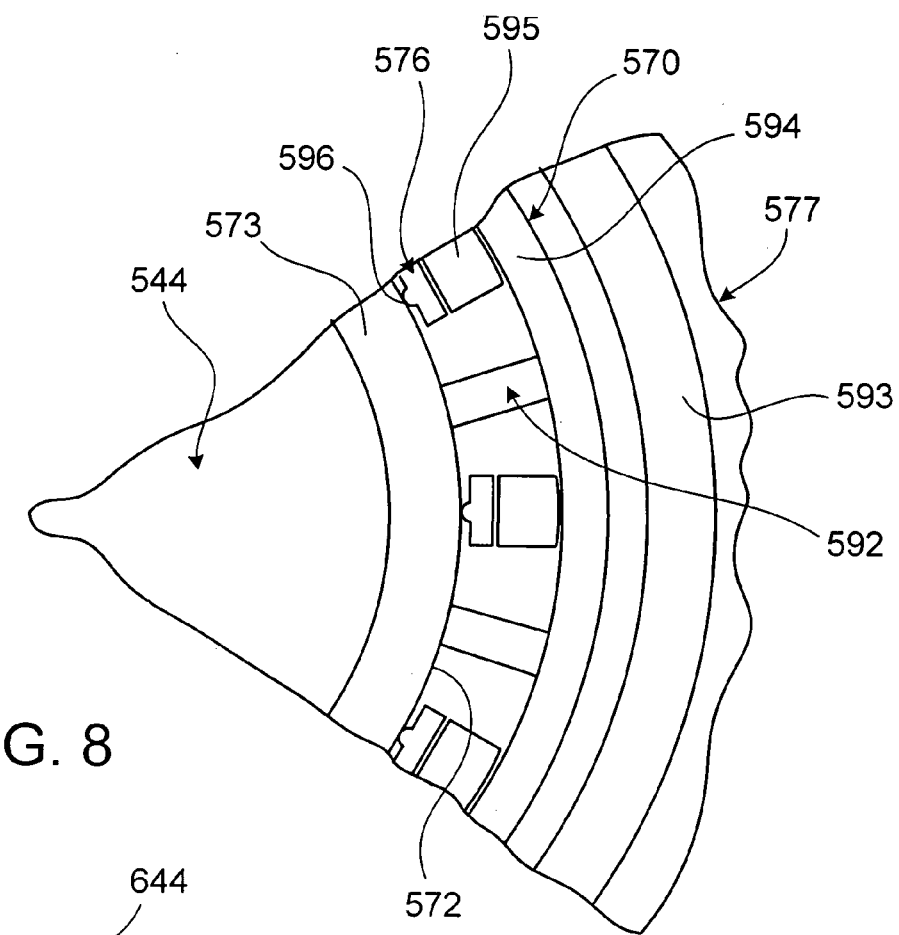
FIG. 8 shows a plan view of the embodiment according to FIG. 7.

FIGS. 7 and 8 show a further alternative of a correction element 544, in which a defined stress distribution is produced by means of the force-inducing device 570. The correction element 544 is in this case an asymmetrically biconcave lens with an upper bevel surface 573 and a lower bevel surface 574 in the edge region. It is held by a plurality of spring arms 592 which can flex in the direction of the optical axis 571 of the correction element 544. To this end, the lower bevel surface 574 bears on a correspondingly chamfered support surface of the spring arms 592.

The spring arms 592 respectively have one spring-arm section adjacent to this support surface, perpendicular to the optical axis 571, and a second spring-arm section extending at right angles thereto, bent off in the direction of the optical axis 571. This second spring-arm section connects with a connecting ring, which carries the second spring-arm sections of all the spring arms 592 and the internal diameter of which is larger than the external diameter of the correction element 544.

On its outer circumferential surface, the connecting ring connects integrally with a spring ring 593 coaxially enclosing the connecting ring. This spring ring has a smaller material thickness compared with the connecting ring, as measured parallel to the optical axis. The spring ring 593 connects the connecting ring integrally with the annular base body 577, which in turn coaxially encloses the spring ring 593 externally.

FIG. 7 shows a detail of the spring-arm mounting of the correction element 544, with a total of six spring arms 592 being visible in this representation, of which two spring arms 592 can respectively be seen in half. In all, the spring-arm mounting according to FIGS. 7 and 8 thus has twenty spring arms 592; these are formed on the circumference of the base body 577 while being equally distributed around it, and their inner spring-arm sections comprising the support surfaces for the correction element 544 extend radially inwards like wheel spokes.

The force-inducing device 570 of the embodiment according to FIGS. 7 and 8 has a support ring 594, which is arranged around the circumferential surface 572 of the correction element 544, coaxially with respect to the optical axis 571. Supported on the inner lateral surface of the support ring 594 are a plurality of piezo-actuators 595 whose length is variable in the direction radial to the optical axis 571. The piezo-actuators 595 are connected to the control device 584 via control lines 583.

The piezo-actuators 595 are supported between the support ring 594 and bearing bodies 576, which bear on the circumferential surface 572 of the correction element 544 and are arranged between the piezo-actuators 595 and the correction element 544. The bearing bodies 576 respectively have two hemispherical bearing projections 596, 597 arranged offset parallel to the direction of the optical axis 571. In the exemplary embodiment of FIGS. 7 and 8, there are a total of twenty piezo-actuators 595, arranged equally distributed in the circumferential direction of the support ring 594, with associated bearing bodies 576. The arrangement of the piezo-actuators 595 in the circumferential direction of the correction element 544 is in this case such that, as shown by the plan view in FIG. 8, a piezo-actuator 595 lies respectively between two spring arms 592 in the circumferential direction of the support ring 594.

The supporting of the piezo-actuators 595 on the support ring 594, on the one hand, and via the bearing bodies 576 on the correction element 544, on the other hand, leads to cantilevered mounting of the force-inducing device 570, carried only by the correction element 544. The piezo-actuators 595 can in this case be displaced parallel to the direction of the optical axis 571 relative to the support ring 594 and, independently therefore, also relative to the bearing bodies 576.

The force-inducing device 570 is mounted, and used to produce a stress distribution in the correction element 544, as follows:

First, the bearing bodies 576 are distributed and aligned around the circumferential surface 572 of the correction element 444, according to the requirements which are placed on the stress distribution which is to be produced. In their setpoint positions, the bearing bodies 576 are provisionally fixed by means of auxiliary fixing elements, for example holding elements fitted on neighbouring spring arms 592. The support ring 594 is thereupon put into position around the circumferential surface 572, and likewise provisionally fixed by means of auxiliary fixing elements. The piezo-actuators 595 are then inserted between the bearing bodies 576 and the support ring 594. The piezo-actuators 595 are dimensioned so that there is a tight fit between the bearing bodies 576 and the support ring 594. The auxiliary fixing elements can then be removed.

The piezo-actuators 595 are adjusted in the direction parallel to the optical axis 571 so that their length variation, and the applied force thereby exerted on the correction element 544 by the respective piezo-actuator via the bearing projections 596, 597, leads to an overall force of the respective piezo-actuator 595 on the correction element 544 which extends along its neutral surface, so that no bending moment is exerted on the correction element 544 by the piezo-actuators 595.

Lastly, as described above in connection with the control device 284, a voltage calculated by the control device 584 is transmitted to the piezo-actuators 595 via the control lines 583 so that a predetermined stress distribution is produced.

As an alternative to the bearing bodies 576 separated from one another in the exemplary embodiment according to FIGS. 7 and 8, a bearing ring configured coaxially with the support ring 594 may also be used instead.

FIGS. 9 to 12 show further variants of bearing bodies, which may be used in connection with the force-inducing devices described above with reference to FIGS. 2 to 8.

Figure 9:
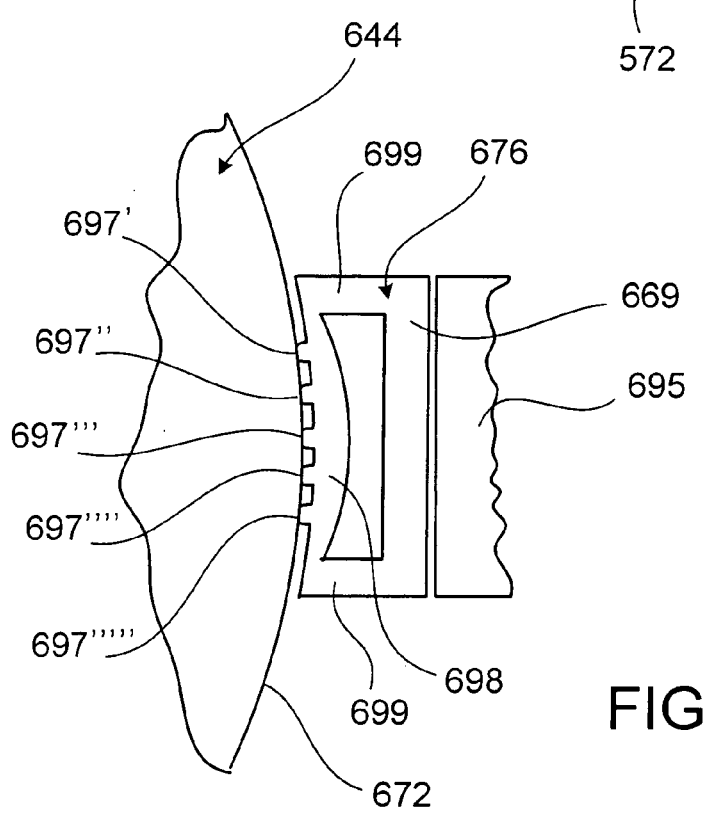

The bearing body 676 in FIG. 9 is pressed by a variable-length piezo-actuator 695 in the direction radial to the optical axis of the correction element 644, against the circumferential surface 672 of the latter. In this case, the bearing body 676 bears on the circumferential surface 672 via a total of 5 bearing projections 697', 697", 697"', 697"", 697""'. The bearing bodies 697' to 697""' are integrally formed on a bearing strip 698, which has an approximately crescent-moon shaped cross-sectional surface in a section plane perpendicular to the optical axis of the correction element 644. The bearing strip 698 is integrally connected via support arms 699 to a support strip 669. The latter bears on the piezo-actuator 695 by its end face remote from the bearing strip 698.

Owing to the cross-sectional surface configuration of the bearing strip 698, it has the highest flexural stiffness in the region of the central bearing projection 697"', which decreases progressively towards the peripheral bearing projections 697' and 697""'. When the piezo-actuator 695 presses on the correction element 644 via the bearing projections 697' to 697""', this cross-sectional surface configuration gives rise to a characteristic pressure distribution on the correction element 644. As in the other described embodiments, this may additionally depend on the cross-sectional surface configuration perpendicular to the bearing strip 698. This pressure distribution leads to a corresponding stress distribution in the correction element 644. Besides the cross-sectional surface configuration of the bearing strip 698, for example, the choice of material for it also has an influence on the flexural stiffness distribution. The bearing strip may in this case consist overall of a material with a constant modulus of elasticity, or alternatively a composite of materials with differing flexural stiffness, which may in particular vary along the bearing strip 698.

FIG. 10 shows a further variant of a bearing body 776. In it, as can be seen by comparing the plan views which are represented, the bearing strip 798 is formed on the other side from the correction element 744 in an approximately complementary way to the bearing strip 698 in FIG. 9, i.e. the cross section of the bearing strip 798 is smallest in the region of the central bearing projection 797"' and increases progressively in the direction of the outer bearing projections 797', 797''''. Pressure on the bearing body 776 by the piezo-actuator 795 therefore results in a correspondingly different pressure distribution on the correction element 744, via the bearing projections 797' to 797'''', than is the case for pressure on the bearing body 676.

FIG. 11 shows a further variant of a bearing body 876. Here, the bearing strip 898 is connected to the support strip 869 via a central connecting section 868. The bearing strip 898 has a similar cross-sectional configuration to the bearing strip 698 according to FIG. 9, hence having the largest cross section with respect to the section plane parallel to the drawing plane of FIG. 11 in the region of the central bearing projection 897''', where it connects with the connecting section 868, which decreases progressively towards the peripheral bearing projections 897' and 897''''. According to the shape of the bearing body 876 and the cross-sectional configuration, as well as the choice of material for the bearing strip 898, pressure exerted on the correction element 844 by means of the piezo-actuator 895 here again leads to a predetermined pressure distribution, which the bearing projections 897' to 897''' exert on the circumferential surface 872 of the correction element 844.

FIG. 12 shows yet another configuration of a bearing body 976. This bears likewise flush on the piezo-actuator 995 on its other side from the correction element 944. Four pressure springs 967' to 967'''', which bear via hemispherical bearing sections on the circumferential surface 972 of the correction element 944, are fitted on the surface remote from the piezo-actuator 995 and facing the circumferential surface 972 of the correction element 944. The pressure springs 967' to 967'''' have different predetermined spring constants. Thus, the two central pressure springs 967'', 967''' have a greater spring strength than the two out-lying pressure springs 967', 967''''. The consequence of this, when pressure is exerted on the bearing body 976 by means of the piezo-actuator 995, is that the two central pressure springs 967'', 967''' exert a larger force on the circumferential surface 972 than the two out-lying pressure springs 967', 967''''.

Depending on the requirements of the stress distribution to be provided, the cross-sectional surface shapes of the bearing strips 698 to 898, or the spring constants of the pressure springs 967' to 967'''', may also have other shapes or value distributions.

The measures which have been described, cited and claimed may be combined in a different way, even if this has not been described in detail.

What is claimed is:

1. An optical apparatus having a pupil plane, the optical apparatus comprising:
   a projection lens having an image plane, the projection lens being configured so that when radiation having wavelength λ is directed through the optical apparatus the optical apparatus images the radiation to the image plane, the projection lens comprising:
      an optical element having a birefringence dependent on a transmission angle of the radiation through the optical element; and
      an optical compensation element positioned close to the pupil plane of the optical apparatus, the optical compensation element being configured to compensate at least partially for an effect of the birefringence of the optical element on the radiation in the image plane,
   wherein an optical property of the optical compensation element has an N-fold symmetry with respect to an optical axis of the optical compensation element, where N is an integer having a value of at least one.

2. The optical apparatus of claim 1, wherein the optical compensation element is positioned so that the position that the imaged radiation passes through the optical compensation element corresponds to the transmission angle of the radiation through the optical element.

3. The optical apparatus of claim 2, wherein the optical compensation element has a birefringence that depends on the position that the radiation passes through the optical compensation element.

4. The optical apparatus of claim 2, wherein the optical compensation element has a polarization-rotating effect that depends on the position that the radiation passes through the optical compensation element.

5. The optical apparatus of claim 2, wherein the optical compensation element has a thickness that varies for radiation passing through the optical compensation element at different positions.

6. The optical apparatus of claim 1, wherein the birefringence of the optical element has N-fold symmetry with respect to the optical axis.

7. The optical apparatus of claim 1, wherein the optical property of the optical compensation element is birefringence.

8. The optical apparatus of claim 1, wherein the optical compensation element comprises a material having an intrinsic birefringence or a stress-induced birefringence for radiation having wavelength λ.

9. The optical apparatus of claim 1, wherein the optical compensation element comprises an optically-active material.

10. The optical apparatus of claim 1, wherein the optical compensation element comprises a cubic fluoride crystalline material.

11. The optical apparatus of claim 1, further comprising a force-inducing device coupled to the optical compensation element and configured to induce a stress in the optical compensation element, wherein the force-inducing device comprises a piezoelectric actuator.

12. The optical apparatus of claim 1, further comprising a force-inducing device coupled to the optical compensation element and configured to induce a stress in the optical compensation element, wherein the force-inducing device is coupled to the optical compensation element via a circumferential surface of the optical compensation element.

13. The optical apparatus of claim 1, further comprising:
   a force-inducing device coupled to the optical compensation element and configured to induce a stress in the optical compensation element; and
   a bearing contacting the optical compensation element that couples a force from the force-inducing element to the optical compensation element to induce the stress in the optical compensation element.

14. The optical apparatus of claim 1, further comprising:
   a force-inducing device coupled to the optical compensation element and configured to induce a stress in the optical compensation element; and
   a control device in communication with the force-inducing device and configured to vary the stressed induced by the force-inducing device in the optical compensation element.

15. The optical apparatus of claim 1, wherein the pupil plane is in the projection lens.

16. The optical element of claim 1, wherein the optical element comprises a cubic fluoride crystalline material.

17. The optical element of claim 16, wherein the cubic fluoride crystalline material comprises a material selected from the group consisting of $CaF_2$, $BaF_2$, and $SrF_2$.

18. The optical element of claim 1, wherein the optical element is positioned between the compensation optical element and the image plane.

19. The optical apparatus of claim 1, further comprising a light source configured to provide the radiation to the projection lens.

20. The optical apparatus of claim 19, further comprising an illumination system configured to direct the radiation from the light source to the projection lens.

21. The optical apparatus of claim 20, further comprising a mask position system configured to position a mask in a path of the radiation between the illumination system and the projection lens.

22. The optical apparatus of claim 20, further comprising an object-positioning system configured to position an object at the image plane.

23. The optical apparatus of claim 1, wherein $\lambda$ is in a range from about 100 nm to about 250 nm.

24. The optical apparatus of claim 1, wherein the projection lens has a numerical aperture in a range from 0.7 to 0.95.

25. A microlithographic projection exposure apparatus comprising the optical apparatus of claim 1.

26. An optical apparatus having a pupil plane, the optical apparatus comprising:
- a projection lens having an image plane, the projection lens being configured so that when radiation having wavelength $\lambda$ is directed through the optical apparatus the optical apparatus images the radiation to the image plane, the projection lens comprising:
  - an optical element having a birefringence dependent on a transmission angle of the radiation through the optical element; and
  - an optical compensation element having a birefringence that depends on the position that the radiation passes through the optical compensation element, the optical compensation element being configured to compensate at least partially for the effects of the birefringence of the optical element on the radiation in the image plane,
- wherein an optical property of the optical compensation element has an N-fold symmetry with respect to an optical axis of the optical compensation element, where N is an integer having a value of at least one.

27. The optical apparatus of claim 26, wherein the optical compensation element is positioned so that the position the radiation passes through the optical compensation element corresponds to the transmission angle of the radiation through the optical element.

28. An optical apparatus having a pupil plane, the optical apparatus comprising:
- a projection lens having an image plane, the projection lens being configured to image radiation having wavelength $\lambda$ directed through the optical apparatus to the image plane, the projection lens comprising:
  - an optical element having a birefringence dependent on a transmission angle of the radiation through the optical element; and
  - an optical compensation element having a polarization-rotating effect that depends on the position that the radiation passes through the optical compensation element, the optical compensation element being configured to compensate at least partially for the effects of the birefringence of the optical element on the radiation in the image plane,
- wherein an optical property of the optical compensation element has an N-fold symmetry with respect to an optical axis of the optical compensation element, where N is an integer having a value of at least one.

29. The optical apparatus of claim 28, wherein the optical compensation element is positioned so that the position the radiation passes through the optical compensation element corresponds to the transmission angle of the radiation through the optical element.

* * * * *